United States Patent
Albadri et al.

(10) Patent No.: US 10,615,297 B2
(45) Date of Patent: Apr. 7, 2020

(54) ELECTRODE FORMATION FOR HETEROJUNCTION SOLAR CELLS

(71) Applicants: INTERNATIONAL BUSINESS MACHINES CORPORATION, Armonk, NY (US); King Abdulaziz City for Science and Technology, Riyadh (SA)

(72) Inventors: Abdulrahman M. Albadri, Riyadh (SA); Bahman Hekmatshoartabari, White Plains, NY (US); Devendra K. Sadana, Pleasantville, NY (US); Katherine L. Saenger, Ossining, NY (US)

(73) Assignees: INTERNATIONAL BUSINESS MACHINES CORPORATION, Armonk, NY (US); KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 985 days.

(21) Appl. No.: 13/774,704

(22) Filed: Feb. 22, 2013

(65) Prior Publication Data

US 2014/0242746 A1 Aug. 28, 2014

(51) Int. Cl.
| | | |
|---|---|---|
| *H01L 21/00* | (2006.01) | |
| *H01L 21/44* | (2006.01) | |
| *H01L 31/0224* | (2006.01) | |
| *H01L 31/0747* | (2012.01) | |
| *H01L 31/18* | (2006.01) | |

(52) U.S. Cl.
CPC .. *H01L 31/022475* (2013.01); *H01L 31/0747* (2013.01); *H01L 31/1884* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 8,222,740 B2 | 7/2012 | Narayan | |
| 8,932,495 B1* | 1/2015 | Nguyen | H01L 31/1884 136/252 |
| 2003/0209717 A1* | 11/2003 | Okazaki | B82Y 20/00 257/80 |
| 2008/0099066 A1* | 5/2008 | Ito et al. | 136/261 |

(Continued)

OTHER PUBLICATIONS

Adurodija, F., et al. "Crystallization Process and Electro-Optical Properties of In2O3 and ITO Thin Films" Journal of Materials Science, vol. 41, No. 21. Nov. 2006. pp. 7096-7102.

Diniz, A., et al. "Crystallisation of Indium-Tin-Oxide (ITO) Thin Films" Renewable Energy 29. Nov. 2003. pp. 2037-2051.

Fang, K., et al. "Low Temperature Crystallization of Indium-Tin-Oxide" Proc. of ASID '06. Oct. 2006. pp. 302-304.

(Continued)

*Primary Examiner* — Moazzam Hossain
*Assistant Examiner* — Stanetta Isaac
(74) *Attorney, Agent, or Firm* — Tutunjian & Bitetto, P.C.; Erik Johnson

(57) ABSTRACT

A method for forming a photovoltaic device includes forming a doped layer on a crystalline substrate, the doped layer having an opposite dopant conductivity as the substrate. A non-crystalline transparent conductive electrode (TCE) layer is formed on the doped layer at a temperature less than 150 degrees Celsius. The TCE layer is flash annealed to crystallize material of the TCE layer at a temperature above about 150 degrees Celsius for less than 10 seconds.

25 Claims, 4 Drawing Sheets

(56) References Cited

U.S. PATENT DOCUMENTS

| | | | |
|---|---|---|---|
| 2008/0295882 A1* | 12/2008 | Stephens et al. | 136/244 |
| 2009/0223549 A1 | 9/2009 | Ounadjela et al. | |
| 2010/0203449 A1* | 8/2010 | Lee | G03F 7/0045 430/281.1 |
| 2011/0174376 A1* | 7/2011 | Lochtefeld et al. | 136/261 |
| 2012/0028399 A1* | 2/2012 | Moslehi | H01L 31/18 438/72 |
| 2012/0223302 A1* | 9/2012 | Yukinobu et al. | 257/43 |
| 2012/0305081 A1* | 12/2012 | Mizuno | H01L 31/02246 136/261 |
| 2012/0309160 A1* | 12/2012 | Ramini | H01L 28/40 438/381 |
| 2013/0196466 A1 | 8/2013 | Zhao et al. | |
| 2014/0166079 A1* | 6/2014 | Bedell | H01L 31/0504 136/249 |

OTHER PUBLICATIONS

Karim, A., et al. "Deposition of Tin-Doped Indium Oxide Films by a Modified Reactive Magnetron Sputtering Process" Thin Solid Films, vol. 172. Dec. 1989. pp. 111-121.

Kim, S., et al. "Transparent Ohmic Contacts on P-GAN Using an Indium Tin Oxide Overlayer" Physica Status Solidi (c), vol. 0, Issue 1. Dec. 2002. pp. 214-218.

Park, J., et al. "Crystallization of Indium Tin Oxide Thin Films Prepared by RF-Magnetron Sputtering Without External Heating" Thin Solid Films 474. Oct. 2004. pp. 127-132.

Ohsaki, H., et al. "Room Temperature Crystallization of Indium Tin Oxide Films on Glass and Polyethylene Terephthalate Substrates Using RF Plasma" Journal of Vacuum Science & Technology A, vol. 25, No. 4. Jul. 2007. pp. 1052-1055.

* cited by examiner

ELECTRODE FORMATION FOR HETEROJUNCTION SOLAR CELLS

BACKGROUND

Technical Field

The present invention relates to photovoltaic devices, and more particularly to devices and methods having improved quality of transparent electrodes without compromising performance.

Description of the Related Art

Photovoltaic devices include transparent conductive electrodes on a front side that permit radiation to pass therethrough. Transparent conductive electrodes may include indium-tin-oxide (ITO). ITO is typically used to form the transparent conductive electrode of heterojunction (HJ) solar cells on crystalline Si (c-Si). High-quality ITO is typically polycrystalline and requires substrate temperatures higher than 150° C. during growth. These formation temperatures may have detrimental effects on hydrogenated amorphous silicon (a-Si:H) and may compromise the quality of the a-Si:H as a result of hydrogen loss from a-Si:H or at the a-Si:H/c-Si interface due to out-diffusion.

In addition, post-deposition annealing can compromise the a-Si:H/c-Si interface quality due to mechanical strain induced by the structural change in ITO during crystallization. In addition, post-deposition annealing may negatively impact a-Si:H or the a-Si:H/c-Si interface due to the loss of hydrogen.

SUMMARY

A method for forming a photovoltaic device includes forming a doped layer on a crystalline substrate, the doped layer having an opposite dopant conductivity as the substrate. A non-crystalline transparent conductive electrode (TCE) layer is formed on the doped layer at a temperature less than 150 degrees Celsius. The TCE layer is flash annealed to crystallize material of the TCE layer at a temperature above about 150 degrees Celsius for less than 10 seconds.

A method for forming a photovoltaic device includes forming a first doped layer on a crystalline substrate, the first doped layer having an opposite dopant conductivity as the substrate; forming a first non-crystalline transparent conductive electrode (TCE) layer on the first doped layer at a temperature less than 150 degrees Celsius; forming a second doped layer on an opposite side of the substrate from the first doped layer, the second doped layer having a dopant conductivity the same as that of the substrate; forming a second TCE layer on the second doped layer at a temperature less than 150 degrees Celsius; and flash annealing the first and second TCE layers to crystallize TCE material at a temperature above 150 degrees Celsius for less than 10 seconds.

A method for forming a heterojunction solar cell includes forming a first intrinsic layer of hydrogenated amorphous Si on a crystalline Si substrate; forming a first doped layer of hydrogenated amorphous Si on the first intrinsic layer, the first doped layer having an opposite dopant conductivity as the substrate; forming a first non-crystalline transparent conductive electrode (TCE) layer including indium tin oxide on the first doped layer at a temperature less than 150 degrees Celsius; forming a second intrinsic layer of hydrogenated amorphous Si on an opposite side of the substrate from the first doped layer; forming a second doped layer of hydrogenated amorphous Si on the second intrinsic layer, the second doped layer having a dopant conductivity the same as that of the substrate; forming a second TCE layer on the second doped layer at a temperature less than 150 degrees Celsius; and flash annealing the first and second TCE layers to crystallize TCE material at a temperature above about 250 degrees Celsius for less than 5 seconds.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
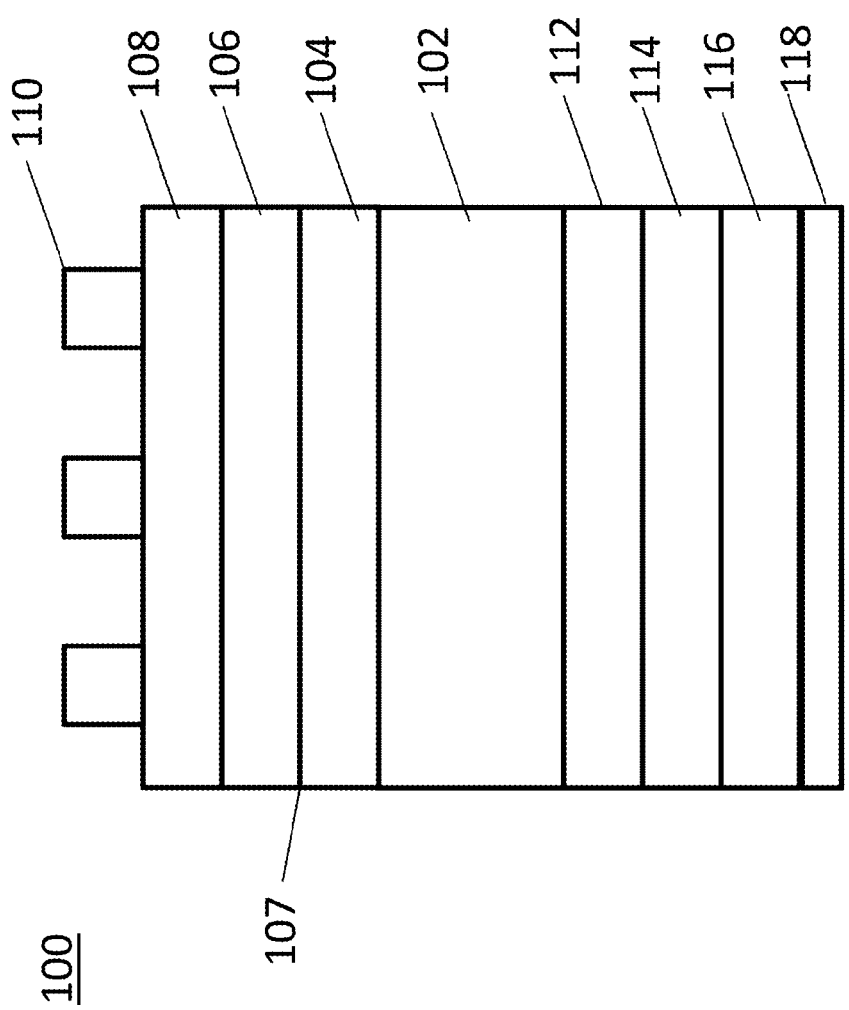
FIG. 1 is a cross-sectional view of a heterojunction photovoltaic device in accordance with the present principles.

In accordance with the present principles, methods and devices are disclosed which include transparent conductive electrodes with improved quality without compromising semiconductor interfaces or significant out-diffusion from active layers. In one embodiment, a photovoltaic device includes a hydrogenated amorphous silicon (a-Si:H) doped layer that interfaces with a transparent conductive electrode. The doped a-Si:H layer and electrode/a-Si:H interface remain intact by performing a low temperature deposition (decreasing crystallinity) and improving the quality (increasing crystallinity) of the electrode material by employing a post-deposition flash anneal without degrading device performance. Performance is maintained by balancing electrode crystallinity against doped layer and doped layer/substrate degradation.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board design may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiC. These compounds include different proportions of the elements within the compound, e.g., SiC includes $Si_xC_{1-x}$ where x is less than or equal to 1, etc. In addition, other elements may be included in the compound, such as, e.g., H or n or p-type dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Heterojunction (HJ) Si solar cells are comprised of at least one heterojunction which is formed between a crystalline Si (c-Si) substrate (i.e., absorption region) and a thin doped layer of amorphous hydrogenated Si (a-Si:H). In this disclosure, if the doped a-Si:H layer has an opposite conductivity type as that of the substrate, it forms an emitter junction. If the doped a-Si:H layer has the same conductivity type as that of the substrate, it forms a back-surface-field (BSF) junction. Optionally, but preferably, a thin intrinsic (i) layer comprised of a-Si:H is inserted between the c-Si substrate and the doped a-Si:H layer to reduce a density of interface states. A transparent conductive oxide, such as, indium tin oxide (ITO) may be employed to form an electrode at the emitter or BSF junction. Both emitter and BSF junctions of HJ solar cell may be comprised of heterojunctions, but hybrid solar cells with one heterojunction and one homojunction may be employed and are contemplated within the scope of this disclosure.

The ITO electrode reduces sheet resistance of the emitter for efficient lateral collection of carriers using a metal grid (e.g., metal fingers) formed on the ITO electrode. This alleviates the high sheet resistance of the thin doped a-Si:H layers, which can be greater than, e.g., 100 MΩ/Square). At the front, the ITO layer also serves as an anti-reflection coating (ARC). At the back, the ITO layer may also serve as a back-reflector in conjunction with a metal contact. To serve as an effective quarter-wavelength ARC or back-reflector, a thickness of ITO is in the range of about 60-120 nm, with the thickness range of 80-100 nm being preferable. Because of this thickness limitation, a sufficiently high ITO conductivity is needed to meet the sheet resistance requirements (note that "sheet resistance"=resistivity/thickness, and "resistivity"=1/conductivity).

In addition, there is a trade-off between transparency and conductivity of ITO. Increasing oxygen content in ITO makes the film more transparent, but less conductive, and vice versa. Therefore, reducing the oxygen content to increase conductivity will reduce the transparency of the ITO and increase the absorption loss in the photovoltaic device. However, the conductivity of ITO may be improved without compromising the transparency, by improving the crystallinity of the ITO. A high-quality poly-crystalline ITO layer which is well suited for photovoltaic applications may have a sheet resistance lower than about 25Ω/Square and transmission of higher than 90% in the visible range at a thickness of about 100 nm. Another aspect of ITO quality with respect to HJ solar cells is the potential barrier between ITO and $p^+$ a-Si:H. Since ITO is of n-type conductivity, a sufficiently high ITO conductivity is needed to form an efficient tunnel junction at the ITO/p+ a-Si:H interface. This can be also achieved by improving the crystallinity of the ITO.

Referring now to the drawings in which like numerals represent the same or similar elements and initially to FIG. 1, a photovoltaic device 100 is shown in accordance with one aspect of the present principles for improving the quality of a transparent electrode 108 without compromising integrity of a doped layer 106 and an electrode/doped layer interface 107. The doped layer 106 includes an opposite dopant conductivity relative to a substrate 102. The doped layer 106 includes, preferably, n+ or p+ dopants depending on the dopant conductivity of the substrate 102. The substrate 102 will be described as a crystalline silicon substrate, although other materials, such as SiC, SiGe, their alloys or the like may be employed.

In one embodiment, substrate 102 includes an n-type substrate. The substrate 102 may include crystalline Si. In one embodiment, the doped layer 106 includes a p-doped amorphous hydrogenated Si (a-Si:H), and the transparent electrode 108 includes ITO. In this case, a second doped layer 114 formed on an opposite side of the substrate 102 is n+ doped.

In another embodiment, the substrate 102 includes a p-type substrate. The substrate 102 may include crystalline Si. The doped layer 106 includes an n+ doped amorphous hydrogenated Si (a-Si:H), and the transparent electrode 108 includes ITO. In this case, the second doped layer 114 formed on the opposite side of the substrate 102 is p+ doped.

In one embodiment, a thin intrinsic layer 104 may be provided on the substrate 102. The intrinsic layer 104 may optionally be employed and includes a-Si:H formed on the substrate 102 between the substrate 102 and the doped layer 106. The doped layer 106 has an opposite conductivity as that of the c-Si substrate 102 and forms an emitter portion or junction. The transparent electrode 108 is deposited on the doped layer 106 and preferably includes ITO although other transparent materials may be employed, e.g., aluminum-doped zinc-oxide (ZnO:Al), etc. The transparent electrode 108 forms an emitter contact.

In one embodiment, the layer 108 thickness may be in the range of 60-120 nm and preferably in the range of 80-100 nm. In one particularly useful embodiment, the ITO layer is about 90 nm thick. The layer 108 may be deposited by radio frequency (RF), direct current (DC) or pulsed DC sputtering at temperatures below 150° C. In particularly useful embodiments, the ITO layer 108 may be deposited by RF, DC or pulsed DC sputtering at temperatures below 50° C., and in particular at about room temperature (about 20 degrees C.).

In other embodiments, layer 108 is deposited by thermal or electron beam evaporation at temperatures below 150° C. In another embodiment, ITO layer 108 is deposited by metal-organic chemical vapor deposition (MOCVD) at temperatures below 150° C. In yet another embodiment, layer 108 is deposited by low-pressure chemical vapor deposition (LPCVD) at temperatures below 150° C.

As before, an optional intrinsic layer 112 may be formed on the substrate 102. A second doped layer 114 is formed on the intrinsic layer 112, if present. Otherwise, the second doped layer 114 may be formed directly on the substrate 102. The second doped layer 114 may be formed by one of the low temperature (below 150 degrees C.) processes described above. This forms a back junction. The transparent conductive electrode layer 116 is then formed on the second doped layer 114 to form a back contact.

The thin intrinsic layer 112 is optionally provided on the substrate 102 on the back contact and includes a-Si:H. The doped layer 114 is formed on the substrate 102 or the intrinsic layer 112, if present. Doped layer 114 has a same conductivity as that of the c-Si substrate 102 (preferably n+ or p+ depending on the dopant conductivity of the substrate 102).

At this point, layers 108 and 116 are both exposed on top and bottom sides of the device 100. Layers 108 and 116 are comprised of transparent conductive electrode material, which can both be subjected to the flash anneal process concurrently, although each side of the device and be processed separately as well.

The layers 108 and 116 may be amorphous, nanocrystalline or micro-crystalline as deposited. The flash anneal is performed to increase the crystallinity of the transparent conductive oxide material of layer 108 and/or layer 116. Layer 116 includes a transparent conductive electrode (TCE) that can benefit from the flash anneal process of the present principles, but need not be made with the flash anneal.

In one example, a post-deposition temperature (flash anneal) of layer 108 and/or layer 116 is in the range of about 150-400 degrees C. In another example, the post-deposition temperature is in the range of about 275-325 degrees C. In yet another example, the post-deposition temperature is about 300 degrees C. Exposure times for the post-deposition temperature in annealing the layer 108 and/or the layer 116 are in the range of about 0.1-10 seconds, and may preferably be about 3-5 seconds.

In one example, the annealing is performed in a dry $N_2$ or forming gas ambient. In another example, the annealing is performed under vacuum. In yet another example, the annealing is performed in ambient conditions (room temperature air and atmospheric pressure). However, annealing under controlled conditions such as dry $N_2$, forming gas or vacuum are preferred.

In one embodiment, the annealing process for layer 108 and/or layer 116 may include annealing (initial anneal) a stack including layer 108, doped layer 106 and the substrate 102 (e.g., ITO/a-Si:H/c-Si) or a stack including layer 108, doped layer 106, substrate 102, second doped layer 114 and layer 116 (e.g., ITO/a-Si:H/c-Si/a-Si:H/ITO) using an anneal at temperatures below 150 degrees C., followed by the described post-deposition annealing step (flash anneal) at 150-400 degrees C. The stacks may include a respective intrinsic layer or layers as well. In one example, the annealing time of the initial anneal is 5 minutes. In another example, the annealing time for the initial anneal is 30 minutes. In yet another example, the annealing time for the initial anneal is 3 hours. Longer or shorter annealing times may be used as well, but the temperature should be maintained below 150 degrees C.

The a-Si:H layers (e.g., the doped layers 106, 114 and/or the intrinsic layers 104, 112) may be grown by plasma-enhanced chemical vapor deposition (PECVD), however, other growth techniques known in the art, such as hot-wire CVD (HWCVD) or sputtering may be employed as well. While the a-Si:H layers include amorphous Si, these layers may include nanocrystalline or microcrystalline portions as well. In the case of PECVD or HWCVD, the gas source used for a-Si:H may include silane ($SiH_4$) although other gases such as disilane ($Si_2H_6$), dichlorosilane (DCS), tetrafluorosilane ($SiF_4$) or combinations thereof may be employed. The a-Si:H layers, in particular p+ doped a-Si:H layers may include carbon (C). The gas source used for C containing layers may include methane ($CH_4$), ethylene ($C_2H_4$), propylene ($C_3H_6$) but other sources (of the form $C_xH_y$) may be employed. In-situ p-type doping may be performed using diborane ($B_2H_6$) or trimethylboron (TMB) sources, and in-situ n-type doping may be performed using a phosphine (PH$_3$) gas source, although other dopant sources may be employed as well.

A carrier gas such as hydrogen (H$_2$), helium (He) or argon (Ar) may be used for any or all of the layers. The carrier gas may be pre-mixed with the gas sources or flowed simultaneously with the gas source at the time of growth. Growth temperatures are usually close to 200 degrees C., with highest quality films grown at temperatures in the range of 150-250 degrees C. Therefore, while temperatures as low as room temperature may be employed, temperatures close to but below 150 degrees C. are preferred.

In one embodiment, the non-crystalline layers 108 and 116 are exposed together (or separately after deposition) to temperatures in a range of between about 150-400° C. for 0.1-10 seconds.

In one embodiment, the i a-Si:H thickness is in the range of 0-10 nm, and the doped a-Si:H layers may have a thickness is in the range of 3-15 nm. In other embodiments, the optional a-Si:H intrinsic layers 104, 112 may include a thickness in the range of 0-20 nm, and the doped a-Si:H layers 106, 114 include a thickness in the range of 3-30 nm. It should be understood that the dopant conductivities for layers 106, 114 may, respectively be p+ type, and n+ type when the substrate 102 is n-type, or respectively be n+ type, and p+ type when the substrate 102 is n-type. In addition, the dopant conductivities for layers 106, 114 may, respectively be n+ type, and p+ type when the substrate 102 is p-type, or respectively be p+ type, and n+ type when the substrate 102 is p-type.

Additional layers may be formed on the layers 108 and 116 as needed. For example, in one embodiment, metal fingers 110 may be formed on the layer 108 to enhance conductivity of the transparent electrode. The formation process of the metal fingers 110 should be maintained below 150 degrees C. A back-reflector 118 (e.g., Al, Ag, Cr, etc.) may be added on layer 116 to provide back reflection to improve efficiency. Others materials and structures are also contemplated.

Figure 2:
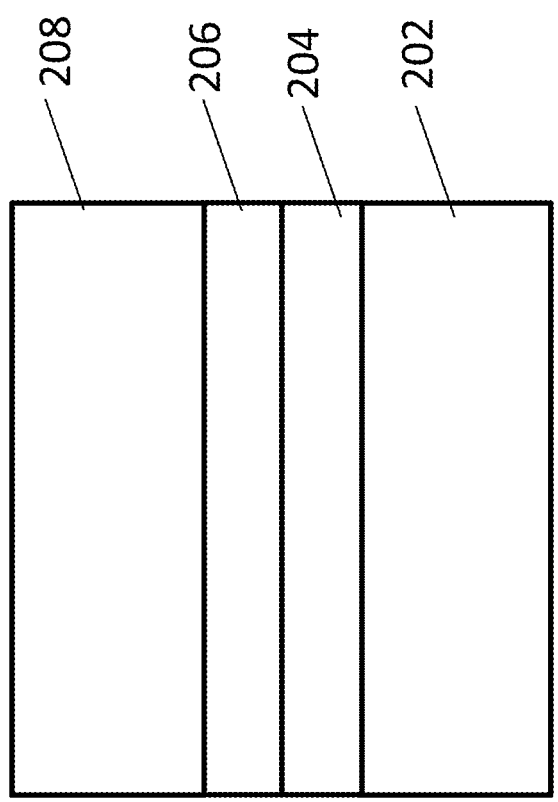
FIG. 2 is a cross-sectional view of a heterojunction test structure employed in x-ray diffraction analysis in accordance with the present principles.

Referring to FIG. 2, a cross-section of a photovoltaic test structure (junction) 200 is shown for performing comparison tests. The structure 200 includes a crystalline Si substrate 202 with p-type dopants. An a-Si:H intrinsic layer 204 having a thickness of about 5 nm was formed. An n+ doped a-Si:H doped layer 206 had a thickness of about 5 nm. An indium tin oxide (ITO) layer 208 had a thickness of about 80 nm. The ITO layer 208 was sputtered on the stack of n$^+$ a-Si:H 206/i a-Si:H 204/p-type c-Si substrate 202 at room temperature. The sheet resistance of the as-deposited ITO layer 208 was measured to be >130Ω/Square. The ITO layer 208 was confirmed to be amorphous by x-ray diffraction (XRD) analysis.

Figure 3:
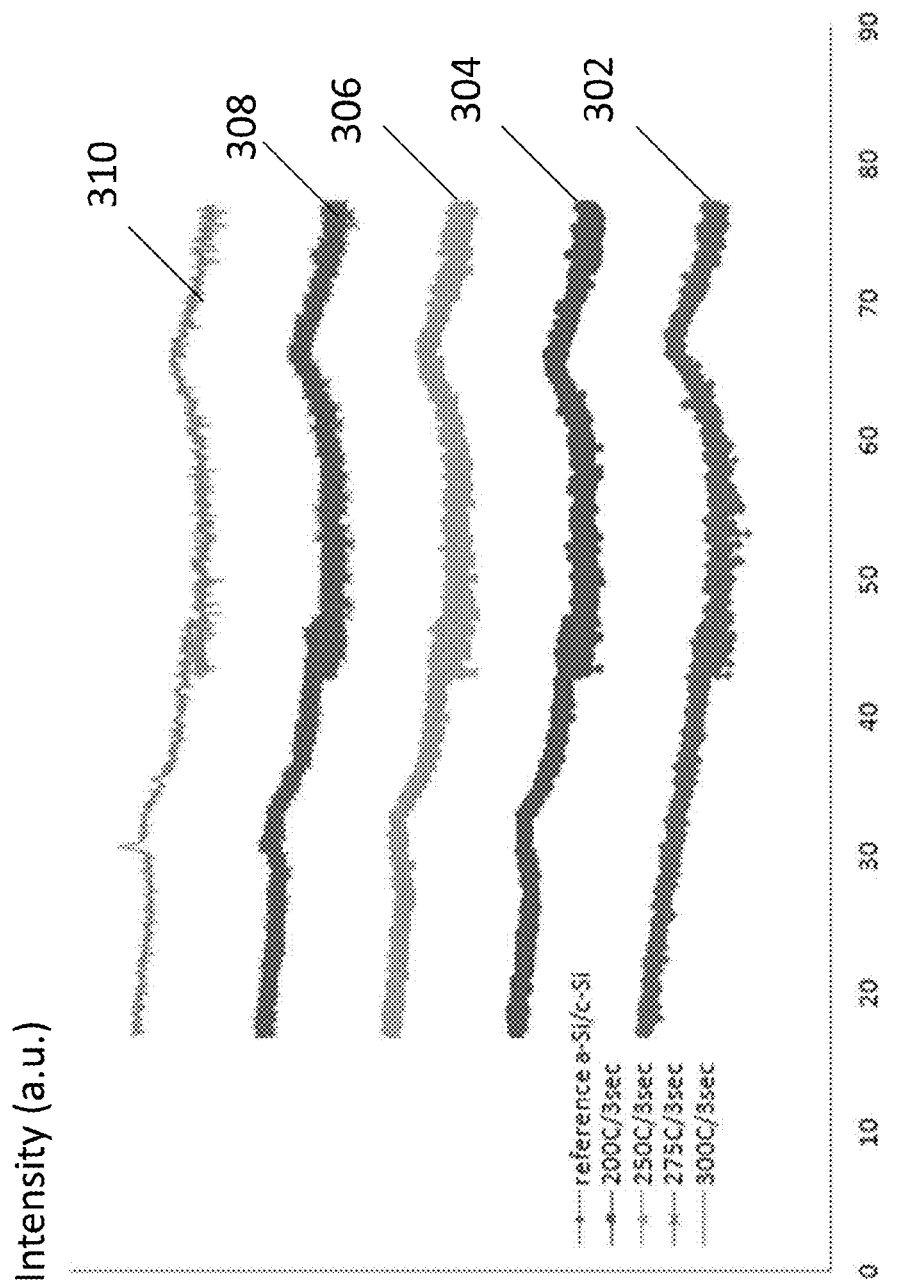
FIG. 3 is a plot of x-ray spectra showing intensity (arbitrary units (a.u.)) plotted versus angle 2θ (x-ray diffraction angle) for samples flash annealed at temperatures between 200-300 degrees C. for 3 seconds in accordance with the present principles.

Referring to FIG. 3, samples of the structure 200 were flash annealed for 3 seconds at various temperatures in the range of 200-300° C. under dry N$_2$ in accordance with the present principles. XRD spectra of the samples were measured and plotted in FIG. 3. Spectra of intensity (arbitrary units (a.u.)) are plotted versus angle 2θ (x-ray diffraction angle). A reference spectra 302 for an a-Si:H layer 206 formed on substrate 202 is shown. Spectra for 3 second flash anneals at temperatures: 300 degrees C. (plot 304), 275 degrees C. (plot 306), 250 degrees C. (plot 308), 200 degrees C. (plot 310) are shown. The broad peak at 2θ=32° is attributed to the presence of the amorphous ITO phase. At above 275° C., a sharp peak evolving at 2θ=30.6° indicates the formation of ITO crystallites. With increased crystallites, sheet resistance decreases.

It should be noted that long annealing times (e.g., one minute or more, especially over 150 degrees C.) are detrimental to the a-Si:H/c-Si, and ITO/a-Si:H interfaces, as described above. In accordance with the present principles, by employing a flash anneal, crystallinity may be achieved without destruction to the a-Si:H/c-Si, and ITO/a-Si:H interfaces. Such destruction is currently experienced with conventional processing.

Figure 4:
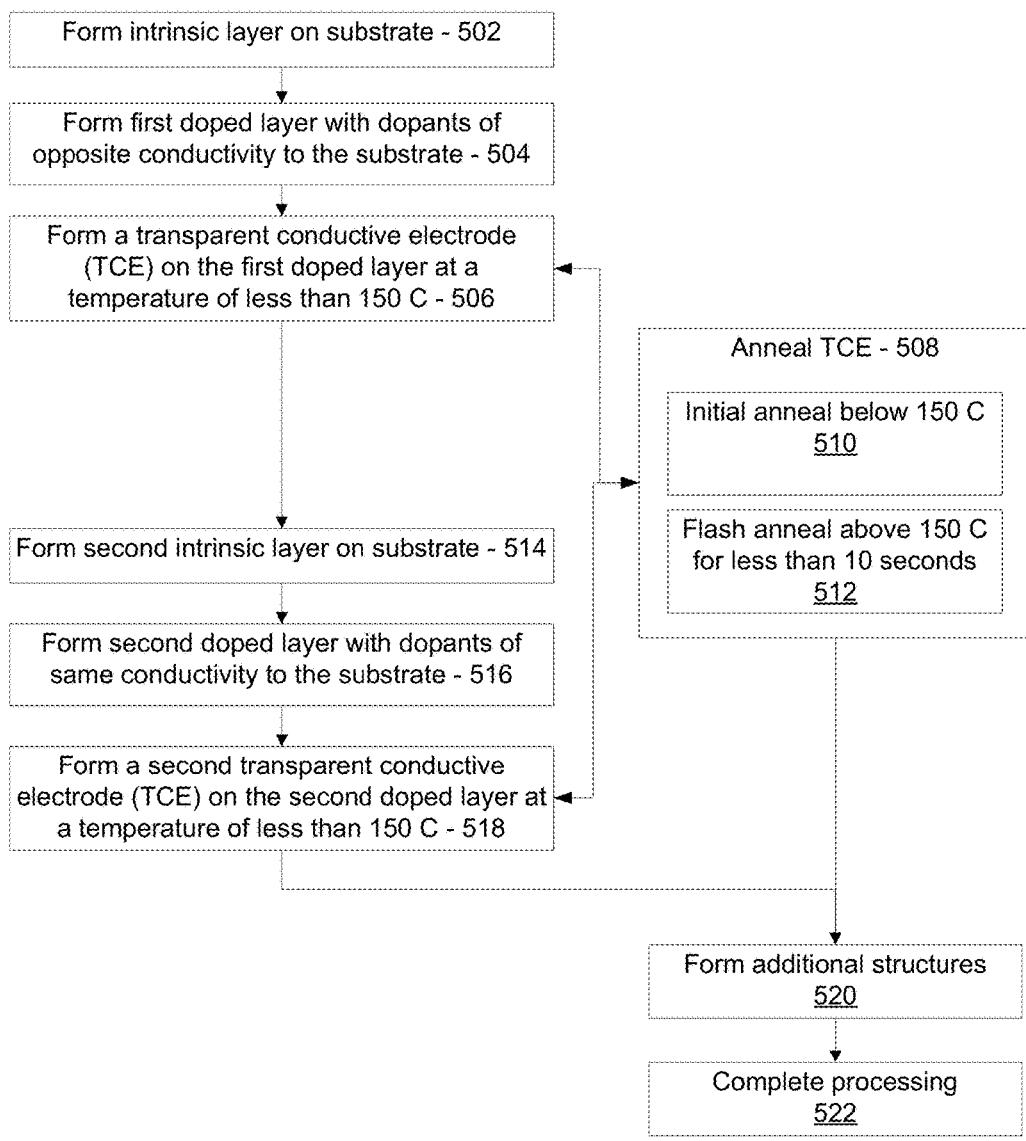
FIG. 4 is a block/flow diagram showing methods for forming a photovoltaic device in accordance with illustrative embodiments.

Referring to FIG. 4, a method for forming a photovoltaic device in accordance with the present principles is illustratively shown. It should also be noted that, in some alternative implementations, the functions noted in the blocks may occur out of the order noted in FIG. 4. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 502, an intrinsic layer may be formed between a substrate and a first doped layer. In block 504, a first doped layer is formed on the crystalline substrate or on the intrinsic layer, if present. The doped layer includes a dopant conductivity opposite that of the substrate. In block 506, a non-crystalline transparent conductive electrode (TCE) layer is formed on the doped layer at a temperature less than 150 degrees Celsius. This can be as low as room temperature (e.g., 20 degrees C.). The non-crystalline TCE layer includes forming a thickness of between 60-120 nm by one of sputtering, evaporation or chemical vapor deposition. In one embodiment, the first doped layer may include amorphous Si and the TCE layer may include indium tin oxide.

In block 508, an anneal process is performed to increase crystallinity of the TCE layer without destruction of the a-Si:H layers (e.g., doped and/or intrinsic layers).

In block 510, an initial anneal may optionally be performed using an anneal temperature below 150° C. for less than about 5 minutes (although initial anneal time may be up to 3 hours).

In block 512, a flash anneal process is performed on the TCE layer to crystallize material of the TCE layer at a temperature above about 150 degrees Celsius for less than 10 seconds (e.g., between about 0.1 and 10 seconds). The flash anneal may include a temperature in the range of between about 250 and 350 degrees Celsius, and preferably about 300 degrees Celsius for about 3 seconds. The anneal process may be performed prior to forming the structures described in blocks 514, 516 and 518, may not be performed until after the formation of a second TCE layer in block 518 or may be performed once after block 506 and once after block 518.

In block 514, a second intrinsic layer may be formed between the substrate and a second doped layer. In block 516, the second doped layer is formed on the crystalline substrate or on the intrinsic layer, if present. The second doped layer is formed on an opposite side of the substrate from the first doped layer. The second doped layer has a dopant conductivity that is the same as that of the substrate. The second dopant layer may include a-Si:H. In block 518, a second TCE layer is formed on the second doped layer. Note that the first doped layer (opposite doping) sequence (blocks 502-506) may be formed after the second doped layer (same doping) sequence (blocks 514-518), as needed.

In block 520, additional conductive structures may be formed on TCE layers. These structures may include back reflectors, metal fingers, etc. In block 522, processing continues to complete the device.

Having described preferred embodiments for electrode formation for heterojunction solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
    forming a doped layer directly on a crystalline substrate, the doped layer comprising hydrogenated amorphous Si having an opposite dopant conductivity as the substrate, the doped layer being formed by sputtering at a temperature no greater than 150° C.;
    forming a non-crystalline transparent conductive electrode (TCE) layer on the doped layer at a temperature less than 150 degrees Celsius; and
    flash annealing the TCE layer to crystallize material of the TCE layer at a temperature above about 150 degrees Celsius for less than 10 seconds, wherein crystallites formed in the TCE layer by the flash annealing reduces a resistance of an electrode to the doped layer of the photovoltaic device.

2. The method as recited in claim 1, wherein the TCE layer includes indium tin oxide.

3. The method as recited in claim 1, wherein flash annealing includes a temperature in the range of between about 250 and 350 degrees Celsius.

4. The method as recited in claim 1, wherein flash annealing includes a temperature of about 300 degrees Celsius for about 3 seconds.

5. The method as recited in claim 1, wherein forming the non-crystalline TCE layer includes forming a thickness of between 60-120 nm by one of sputtering, evaporation or chemical vapor deposition.

6. The method as recited in claim 1, wherein forming the non-crystalline TCE layer includes forming the TCE layer at 50 degrees Celsius or less.

7. The method as recited in claim 1, wherein forming the non-crystalline TCE layer includes forming the TCE layer at room temperature.

8. The method as recited in claim 1, further comprising forming an intrinsic layer between the substrate and the doped layer.

9. The method as recited in claim 1, further comprising:
    forming a second doped layer on an opposite side of the substrate from the doped layer, the second doped layer having a dopant conductivity the same as that of the substrate; and
    forming a second TCE layer on the second doped layer.

10. The method as recited in claim 9, further comprising:
    forming the second TCE layer at a temperature less than 150 degrees Celsius; and
    flash annealing the TCE layer to crystallize material of the second TCE layer at a temperature above 150 degrees Celsius for less than 10 seconds.

11. The method as recited in claim 9, further comprising forming a second intrinsic layer between the substrate and the second doped layer.

12. A method for forming a photovoltaic device, comprising:
    forming a first doped layer directly on a crystalline substrate, the first doped layer comprising hydrogenated amorphous Si having an opposite dopant conductivity as the substrate, the first doped layer being formed by sputtering at a temperature no greater than 150° C.;
    forming a first non-crystalline transparent conductive electrode (TCE) layer on the first doped layer at a temperature less than 150 degrees Celsius;
    forming a second doped layer on an opposite side of the substrate from the first doped layer, the second doped layer having a dopant conductivity the same as that of the substrate;
    forming a second TCE layer on the second doped layer at a temperature less than 150 degrees Celsius; and
    flash annealing the first and second TCE layers to crystallize TCE material at a temperature above 150 degrees Celsius for less than 10 seconds, wherein crystallites formed in the TCE layer by the flash annealing reduces a resistance of an electrode to the doped layer of the photovoltaic device.

13. The method as recited in claim 12, wherein the second doped layer includes hydrogenated amorphous Si and the first and second TCE layers include indium tin oxide.

14. The method as recited in claim 12, wherein flash annealing includes a temperature in the range of between about 250 and 350 degrees Celsius.

15. The method as recited in claim 12, wherein flash annealing includes a temperature of about 300 degrees Celsius for about 3 seconds.

16. The method as recited in claim 12, wherein forming the first TCE layer includes forming a thickness of between 60-120 nm by one of sputtering, evaporation or chemical vapor deposition.

17. The method as recited in claim 12, wherein forming the first and second TCE layers includes forming the TCE layers at 50 degrees Celsius or less.

18. The method as recited in claim 12, wherein forming the first and second TCE layers includes forming the TCE layers at room temperature.

19. The method as recited in claim 12, further comprising forming an intrinsic layer between at least one of the substrate and the first doped layer, and the substrate and the second doped layer.

20. A method for forming a heterojunction solar cell, comprising:
    forming a first intrinsic layer of hydrogenated amorphous Si directly on a crystalline Si substrate;
    forming a first doped layer of hydrogenated amorphous Si on the first intrinsic layer, the first doped layer having an opposite dopant conductivity as the substrate, the first doped layer being formed by sputtering at a temperature no greater than 150° C.;
    forming a first non-crystalline transparent conductive electrode (TCE) layer including indium tin oxide on the first doped layer at a temperature less than 150 degrees Celsius;
    forming a second intrinsic layer of hydrogenated amorphous Si on an opposite side of the substrate from the first doped layer;

forming a second doped layer of hydrogenated amorphous Si on the second intrinsic layer, the second doped layer having a dopant conductivity the same as that of the substrate;

forming a second TCE layer on the second doped layer at a temperature less than 150 degrees Celsius; and flash annealing the first and second TCE layers to crystallize TCE material at a temperature above about 250 degrees Celsius for less than 5 seconds, wherein crystallites formed in the TCE layer by the flash annealing reduces a resistance of an electrode to the doped layer of the photovoltaic device.

21. The method as recited in claim 20, wherein flash annealing includes a temperature in the range of between about 250 and 350 degrees Celsius.

22. The method as recited in claim 20, wherein flash annealing includes a temperature of about 300 degrees Celsius for about 3 seconds.

23. The method as recited in claim 20, wherein forming the first TCE layer includes forming a thickness of between 60-120 nm by one of sputtering, evaporation or chemical vapor deposition.

24. The method as recited in claim 20, wherein forming the first and second TCE layers includes forming the TCE layers at 50 degrees Celsius or less.

25. The method as recited in claim 20, wherein forming the first and second TCE layers includes forming the TCE layers at room temperature.

* * * * *